(12) United States Patent
Jeon et al.

(10) Patent No.: US 8,097,510 B2
(45) Date of Patent: Jan. 17, 2012

(54) METHOD OF FORMING LATERAL TRENCH GATE FET WITH DIRECT SOURCE-DRAIN CURRENT PATH

(75) Inventors: Chang-ki Jeon, Kimpo (KR); Gary Dolny, Mountain Top, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/890,947

(22) Filed: Sep. 27, 2010

(65) Prior Publication Data

US 2011/0014760 A1 Jan. 20, 2011

Related U.S. Application Data

(62) Division of application No. 11/479,149, filed on Jun. 29, 2006, now Pat. No. 7,804,150.

(51) Int. Cl.
H01L 21/336 (2006.01)

(52) U.S. Cl. .................. 438/269; 257/E21.41

(58) Field of Classification Search .......... 257/343, 257/E29.027, E21.41; 438/269
See application file for complete search history.

(56) References Cited

U.S. PATENT DOCUMENTS

| | | | |
|---|---|---|---|
| 4,626,879 A | 12/1986 | Colak | |
| 4,754,310 A * | 6/1988 | Coe | 257/287 |
| 5,422,502 A | 6/1995 | Kovacic | |
| 5,629,543 A | 5/1997 | Hsieh et al. | |
| 5,640,034 A | 6/1997 | Malhi | |
| 5,828,101 A | 10/1998 | Endo | |
| 6,163,051 A | 12/2000 | Nakagawa et al. | |
| 6,207,994 B1 | 3/2001 | Rumennik et al. | |
| 6,507,071 B1 * | 1/2003 | Tihanyi | 257/343 |
| 6,566,709 B2 | 5/2003 | Fujihira | |
| 6,621,132 B2 | 9/2003 | Onishi et al. | |
| 6,835,993 B2 | 12/2004 | Sridevan et al. | |
| 7,005,351 B2 | 2/2006 | Henninger et al. | |
| 7,126,166 B2 * | 10/2006 | Nair et al. | 257/110 |
| 7,345,342 B2 | 3/2008 | Challa et al. | |
| 7,470,960 B1 * | 12/2008 | Sugawara | 257/401 |
| 7,804,150 B2 | 9/2010 | Jeon et al. | |
| 2001/0026989 A1 | 10/2001 | Thapar | |
| 2002/0027237 A1 | 3/2002 | Onishi et al. | |
| 2002/0105024 A1 * | 8/2002 | Fujihira | 257/328 |
| 2002/0105026 A1 | 8/2002 | Fujihira | |
| 2003/0085448 A1 | 5/2003 | Cai et al. | |
| 2004/0135228 A1 | 7/2004 | Iwamoto et al. | |
| 2004/0217377 A1 * | 11/2004 | Deboy | 257/197 |
| 2005/0001265 A1 | 1/2005 | Shiraki et al. | |
| 2005/0218431 A1 | 10/2005 | Nair et al. | |
| 2006/0273386 A1 | 12/2006 | Yilmaz et al. | |

FOREIGN PATENT DOCUMENTS

CN 1667838 A 9/2005

OTHER PUBLICATIONS

Chinese Office Action for Application No. CN200780024515.3, dated Mar. 2, 2010, 35 pages.

(Continued)

*Primary Examiner* — Zandra V. Smith
*Assistant Examiner* — Igwe U Anya
(74) *Attorney, Agent, or Firm* — Kilpatrick Townsend & Stockton LLP

(57) ABSTRACT

A method of forming a field effect transistor (FET) includes: forming a drift region comprising a stack of alternating conductivity type silicon layers; forming a drain region of a first conductivity type extending into the stack of alternating conductivity type silicon layers; forming a trench gate extending into the stack of alternating conductivity type silicon layers, the trench gate having a non-active sidewall and an active sidewall being perpendicular to one another; and forming a body region of a second conductivity type adjacent to the active sidewall of the trench gate, wherein the trench gate and the drain region are formed such that the non-active sidewall of the trench gate faces the drain region.

15 Claims, 7 Drawing Sheets

OTHER PUBLICATIONS

International Search Report of the International Searching Authority for Application No. PCT/US2007/072034, mailed on May 16, 2008, 3 pages.
Written Opinion of the International Searching Authority for Application No. PCT/US2007/072034, mailed on May 16, 2008, 4 pages.
Preliminary Report on Patentability for Application No. PCT/US2007/072034, mailed on Jan. 15, 2009, 5 pages.
Non-Final Office Action for U.S. Appl. No. 11/479,149, mailed on Jun. 1, 2009, 21 pages.
Final Office Action for U.S. Appl. No. 11/479,149, mailed on Nov. 25, 2009, 17 pages.
Notice of Allowance for U.S. Appl. No. 11/479,149, mailed on May 27, 2010, 9 pages.

* cited by examiner (Reproduced)

(Reproduced)

(Reproduced)

(Reproduced)

(Reproduced)

METHOD OF FORMING LATERAL TRENCH GATE FET WITH DIRECT SOURCE-DRAIN CURRENT PATH

CROSS-REFERENCE TO RELATED APPLICATIONS

This application is a divisional of U.S. application Ser. No. 11/479,149, filed Jun. 29, 2006, which is incorporated herein by reference in its entirety for all purposes.

BACKGROUND

The invention relates to semiconductor power device technology, and more particularly to structure and method of forming an improved trench-gate laterally-diffused FET.

Power MOSFET devices are widely used in numerous electronic apparatus, including automotive electronics, disk drives and power supplies. Generally, these apparatus function as switches and are used to connect a power supply to a load. One of the areas in which MOSFET devices are used is radio frequency (RF) applications. Such RF MOSFET devices are lateral transistors. Recent advances in lateral (or laterally-diffused) MOSFET (LDMOS) devices have improved their performance and cost characteristics when compared to vertical MOSFET devices for RF power amplifiers in base station applications.

High voltage LDMOS devices in accordance with the Reduced Surface Field (RESURF) principal provide an extended drain region that is used to support the high off-state voltage, while reducing the on-resistance. The low-doped, extended drain region operates as a drift region for transferring carriers when the device is in the "on" state. On the other hand, if the device is in the "off" state, the extended drain region becomes a depletion region to reduce the electric field applied thereon, resulting in an increase in breakdown voltage.

The drift resistance of the extended drain region, and thus the device on-resistance $R_{DSon}$, may be further reduced by increasing the concentration of impurities in the low-doped drain region. Moreover, additional layers in the extended drift region help deplete the drift region when the drift region is supporting a high voltage. These additional alternating conductivity type layers are called charge balancing or field-shaping layers and have led to development of super-junction structures in a number of RESURF LDMOS technologies.

However, there is a trade-off between the on resistance and the breakdown voltage $V_{BD}$ because of the difficulty in extending the boundaries of the depletion layer with the higher charge density caused by the increased impurity concentration. Recently, multiple RESURF LDMOS devices using super junction structures have been proposed to lower the $R_{DSon}$ without decreasing $V_{BD}$. However, these prior art LDMOS devices using super-junction structures suffer from a number of drawbacks. For example, proposed LDMOS devices having multiple p-type charge balancing layers in the silicon bulk region and a surface gate electrode suffer from high JFET resistance that increases $R_{DSon}$ due to the long current path from the surface gate to the charge balancing layers. Other proposed LDMOS devices with multiple p-type field shaping layers in the silicon bulk region use trenched gate electrodes where the current flows around the trench gate and through the inversion layers. However, the flow of current around the gate and through inversion layers results in a high inversion channel resistance that increases $R_{DSon}$.

What is needed are structures and methods that provide an improved LDMOS according to the RESURF principal. In particular what is needed is a LDMOS device with reduced on-resistance that also allows careful control of charges in the extended drain region to maintain a high breakdown voltage $V_{BD}$.

BRIEF SUMMARY

In accordance with an embodiment of the invention, a field effect transistor includes a trench gate extending into a semiconductor region. The trench gate has a front wall facing a drain region and a side wall perpendicular to the front wall. A channel region extends along the side wall of the trench gate, and a drift region extends at least between the drain region and the trench gate. The drift region includes a stack of alternating conductivity type silicon layers.

In one embodiment, when the FET is an on state, a current flows laterally from the channel region to the drain region through those silicon layers of the stack having the first conductivity type.

In another embodiment, a body region of the second conductivity type is located adjacent to the side wall of the trench gate, and a source region of the first conductivity type is located in the body region. The channel region extends in the body region between an outer perimeter of the source region and an outer perimeter of the body region.

In another embodiment, a heavy body region is located adjacent to the source region.

In yet another embodiment, the stack of alternating conductivity type silicon layers extend over a substrate of a second conductivity type, and the heavy body region vertically extends through the stack of alternating conductivity type silicon layers and terminates within the substrate.

In yet another embodiment, those silicon layers of the stack having a second conductivity type are spaced from the channel region to allow a current exiting the channel region to flow through those silicon layers of the stack having the first conductivity type.

In another embodiment, those silicon layers of the stack having a second conductivity type are discontinuous directly underneath the channel region to allow a current exiting the channel region to flow through those silicon layers of the stack having the first conductivity type.

In accordance with another embodiment of the invention, a field effect transistor is formed as follows. A drift region comprising a stack of alternating conductivity type silicon layers is formed. A drain region of a first conductivity type extending into the stack of alternating conductivity type silicon layers is formed. A trench gate extending into the stack of alternating conductivity type silicon layers is formed such that the trench gate has a non-active sidewall and an active sidewall being perpendicular to one another. A body region of a second conductivity type is formed adjacent the active sidewall of the trench gate. The trench gate and the drain region are formed such that the non-active sidewall of the trench gate faces the drain region.

In one embodiment, a source region of the first conductivity type is formed in the body region such that a channel region is formed in the body region between an outer perimeter of the source region and an outer perimeter of the body region.

In another embodiment, a heavy body region is formed adjacent to the source region.

In yet another embodiment, the stack of alternating conductivity type silicon layers is formed over a substrate of a second conductivity type, and the heavy body region is formed so as to vertically extend through the stack of alternating conductivity type silicon layers and terminate within the substrate.

In another embodiment, the stack of alternating conductivity type silicon layers is formed such that those silicon layers of the stack having a second conductivity type are spaced from the channel region to allow a current exiting the channel region to flow through those silicon layers of the stack having the first conductivity type.

In another embodiment, the stack of alternating conductivity type silicon layers is formed such that those silicon layers of the stack having a second conductivity type are discontinuous directly underneath the channel region to allow a current exiting the channel region to flow through those silicon layers of the stack having the first conductivity type.

A further understanding of the nature and the advantages of the invention disclosed herein may be realized by reference to the remaining portions of the specification and the attached drawings.

DETAILED DESCRIPTION

The following description provides specific details in order to provide a thorough understanding of the invention. The skilled artisan, however, would understand that the invention can be practiced without employing these specific details. The invention can be practiced by modifying the illustrated structure and method and can be used in conjunction with apparatus and techniques conventionally used in the industry.

RESURF LDMOS devices with charge balance structures in the drift region have a lower on-resistance $R_{DSon}$ for the same breakdown voltage as compared to LDMOS devices with no charge balance structures. In accordance with an embodiment of the invention, laterally extending interleaved silicon layers of alternating conductivity type are optimally integrated in a trench gate LDMOS. The total charge of each of the charge balance layers is matched to that of its adjacent opposite conductivity type layer thereby enabling the use of a high concentration drift region with reduced $R_{DSon}$, while adequate blocking in the off state is obtained by depleting charges from the drift region and the buried layers. Moreover, since the resistance of the channels is inversely proportional to the total charge in the channels, each additional buried layer results in a reduction in on-resistance of the device.

Figure 1:
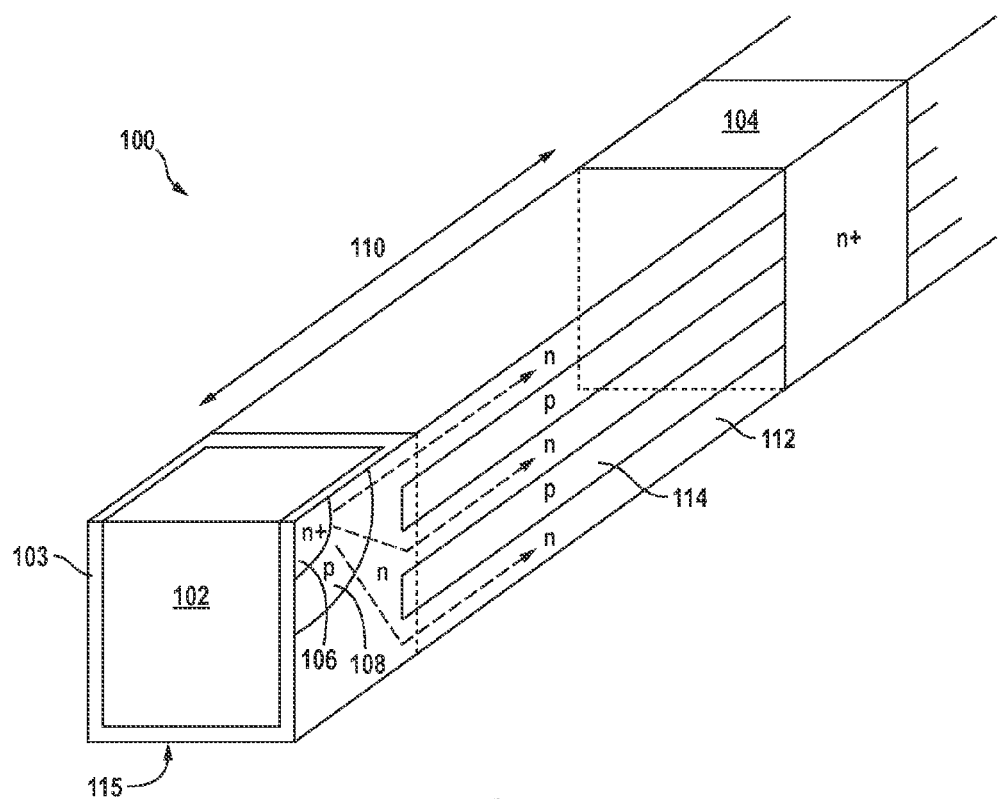
FIG. 1 shows an isometric view of a trench gate LDMOS according to an embodiment of the invention.

FIG. 1 shows an isometric view of a portion of a trenched gate LDMOS 100 with drift region 110 including multiple interleaved layers with adjacent layers having alternating conductivity type, according to an embodiment of the invention. In FIG. 1 the imprint of various regions (including source region 106, body region 106, n layers 112, p layers 114) are shown on a sidewall of trench gate 115. The alternating n-type layers 112 and p-type layers 114 extend in drift region 110. In the embodiment shown, interleaved n-type layers 112 are the layers through which the current flows when the transistor is in the on state, while p-type layers 114 together with their adjacent n-type layers 112 form the charge balance structure.

Trench gate 115 includes a dielectric layer 103 extending along its sidewalls and bottom surface. In one embodiment, the thickness of the dielectric layer along the trench bottom surface is greater than that of the dielectric layer along the trench sidewalls. This helps reduce the gate to drain capacitance. A gate electrode 102 (e.g., comprising polysilicon) fills trench 115. In one variation, the gate electrode is recessed in trench 115.

Highly doped n-type drain region 104 is laterally spaced from trench gate 115 and extends through the interleaved n-p layers 112, 114 thus electrically shorting n layers 112 together. While drain region 104 is shown to extend to the same depth as the very bottom p-layer 112 of the interleaved layers, it may alternatively be formed to extend to a deeper or shallower depth. Highly doped n-type source regions 106 and p-type body regions 108 are formed along sides of the trench not facing drain region 104. That is, the source and body regions are not located between trench gate 115 and drain region 104. This configuration is particularly advantageous as it provides a direct path for current flow between source region 106 and drain region 104, and thus improves the device $R_{DSon}$.

When LDMOS 100 is in the on state, a channel region is formed in the body region along the trench sidewall. The current flow is shown in FIG. 1 by dashed arrows. As can be seen, carriers flow from source regions 106 into body region 108 along the trench sidewall in multi-directions, then spread through n layers 112 of the interleaved layers, and finally get collected at drain region 104. The resistance in this current path is reduced by preventing p layers 114 from extending under the channel region. However, in an alternate embodiment, p layers 114 are extended under the channel region which advantageously eliminates the process steps needed to prevent p layers 114 from extending under the channel region.

Figure 2:
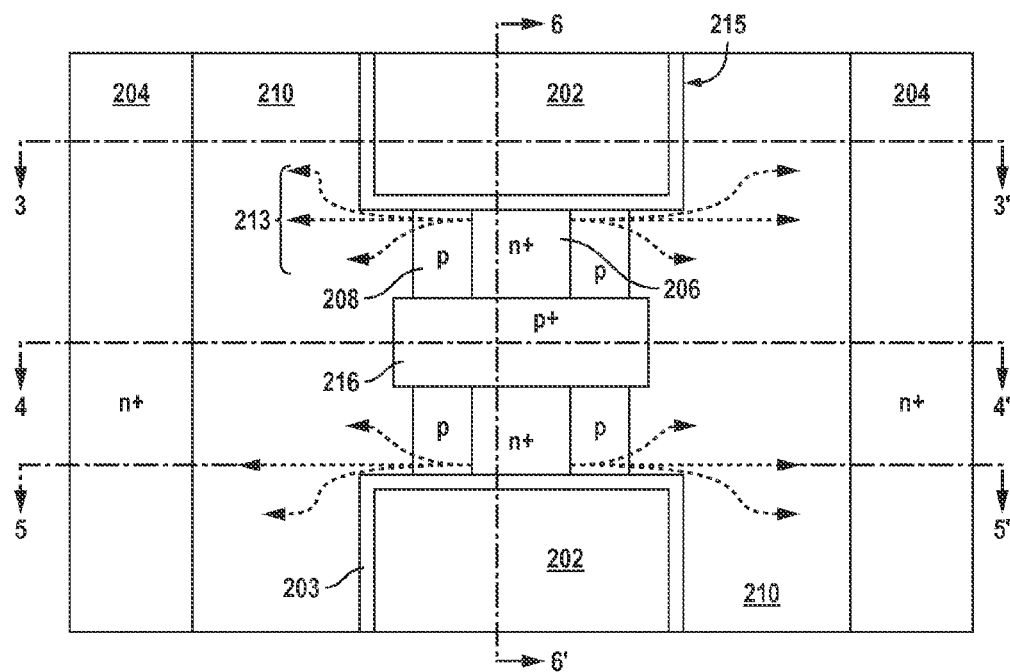
FIG. 2 shows a floor plan view of a trench gate LDMOS according to an embodiment of the invention.
Figure 2:
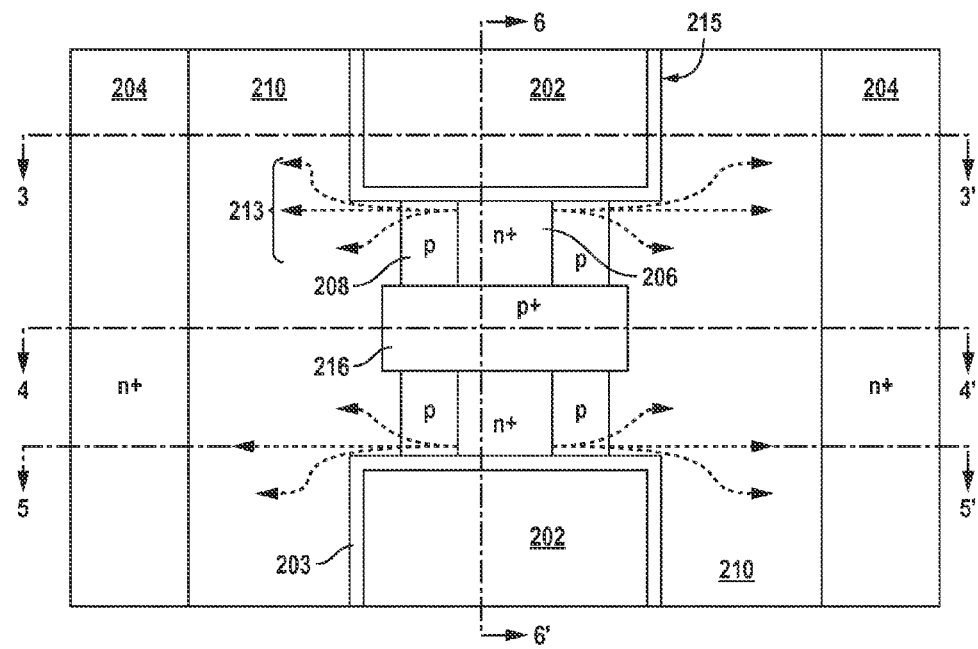

FIG. 2 shows a floor plan of a trenched gate LDMOS according to an embodiment of the invention. Two trench gates 215 are vertically spaced from one another, with a p-type body region 208 extending between them. Each trench gate includes a gate electrode 202 which is insulated from adjacent silicon regions by a dielectric layer 203. N+ source regions 206 are located adjacent each trench inside body region 208. P+ heavy body region 216 is located between the two adjacent source regions 206, and in the horizontal direction, extends beyond the edges of body region 208. Heavy body region 216 serves to reduce the base resistance of a parasitic n-p-n bipolar transistor formed between the n-type source region 206, p-type body region 208 and n-type drain region 204. This ensures that the parasitic n-p-n never turns on and the device remains robust during events such as avalanche breakdown or unclamped inductive switching (UIS). Heavy body region 216 more effectively performs this function if it extends beyond the edges of body region 208.

A source interconnect layer (not shown) contacts the source and heavy body regions. N+ drain regions 204 are laterally spaced from trench gates 202, with a drain interconnect layer (not shown) contacting drain region 204. The layout pattern shown in FIG. 2 is repeated and mirrored in all four directions many times.

As can be seen, source region 206, body region 208, and heavy body region 216 are all formed on those sides of trenches 215 that face away from drain regions 204. These sides of trenches 215 will hereinafter be referred to as the "active sides" or "active sidewalls" and the sides with no source and body regions (i.e., sides facing drain regions 204) will be referred to as "non-active sides" or "non-active sidewalls." In one embodiment, dielectric layer 203 in trenches 215 has a greater thickness along the bottom and/or the non-active sides of trench gates 215 than along their active sides. This helps minimize the gate to drain capacitance Cgd. In other embodiments, source and body regions are formed along only one sidewall, or two sidewalls, or three sidewalls, or all four sidewalls of each trench gate 215 (i.e., each trench may have one, two, three or four active sidewalls). The embodiments with more active sidewalls provide a higher device current rating.

The current flow, when the LDMOS is in the on state, is illustrated in FIG. 2 by dotted arrows 213. As shown, the current flows from source regions 206 through body region 208 along the active sides of trenches 215, and then spreads out as it exits the body region. The current then flows through the n-layers of the interleaved layers (not shown) toward drain regions 204, and is finally collected at drain regions 204. Thus, the layout configuration in FIG. 2 advantageously forms a current path from source regions 206 to drain regions 204 which is free of any structural barriers, reducing the transistor on-resistance. The structure of the LDMOS in FIG. 2 is more fully described next using cross sectional views along lines 3-3', 4-4', 5-5', and 6-6' in FIGS. 3, 4, 5, and 6. The floor plan in FIG. 2 is reproduced directly above each of FIGS. 3-6 to enable better visualization of the structural features of the LDMOS.

Figure 3:
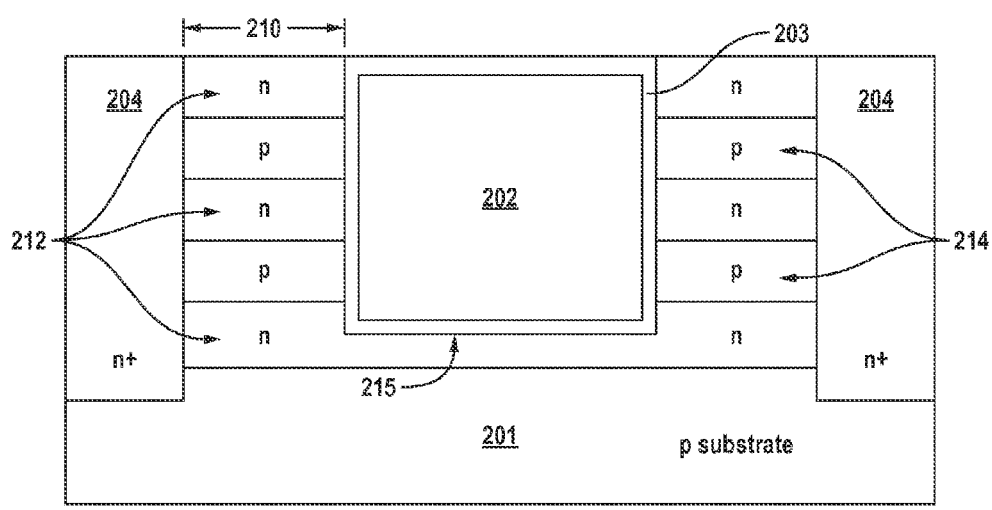
FIG. 3 shows the cross sectional view at cut-line 3-3' in FIG. 2.
Figure 2:
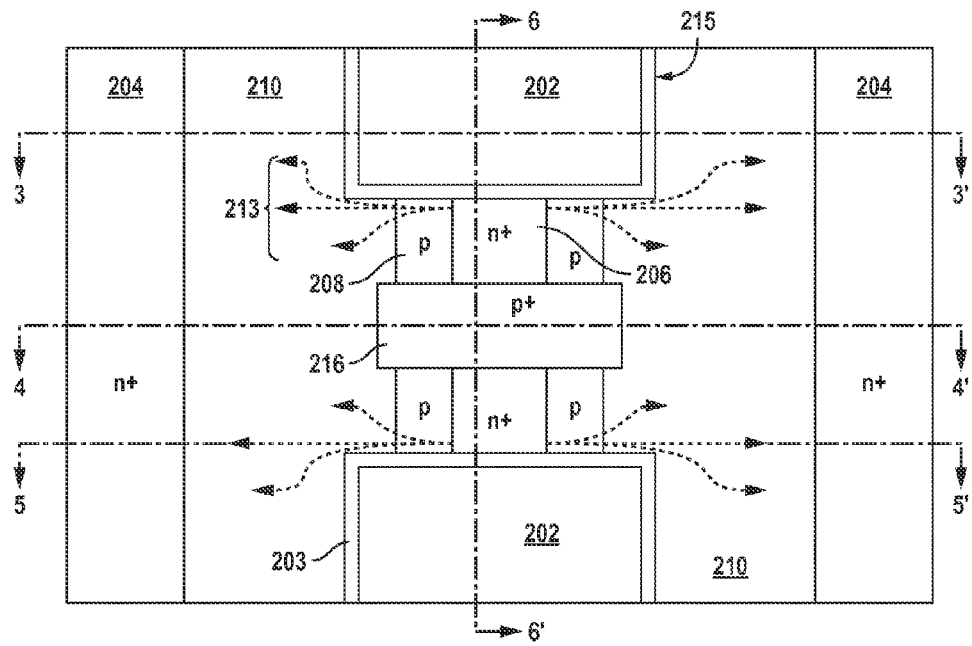

FIG. 3 shows the cross sectional view at cut-line 3-3' of the floor plan in FIG. 2. In FIG. 3, if a vertical line were drawn along the center of trench gate 215 dividing the cross sectional view into right and left halves, the right half would correspond to the isometric view in FIG. 1. Trench gate 215 includes a recessed gate electrode 202 with a dielectric layer 203 extending along the sidewalls and bottom surface of the trench as well as over gate electrode 202. In an alternate embodiment, gate electrode 202 is not recessed thus completely filling each trench gate 215. In drift region 210, alternating charge balance layers 212, 214 extend horizontally between non-active sides of trench gate 215 and drain regions 204. The structure is formed over a p-type substrate 201. Drain regions 204 extend deep to reach into p substrate 201, and electrically short n-type layers 212 of the charge balance structure.

Figure 4:
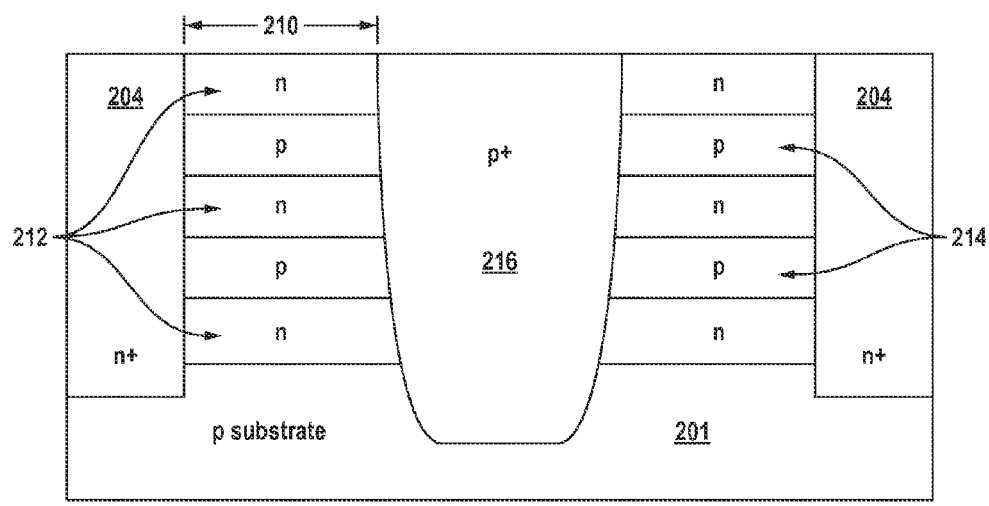
FIG. 4 shows the cross sectional view at cut-line 4-4' in FIG. 2.
Figure 2:
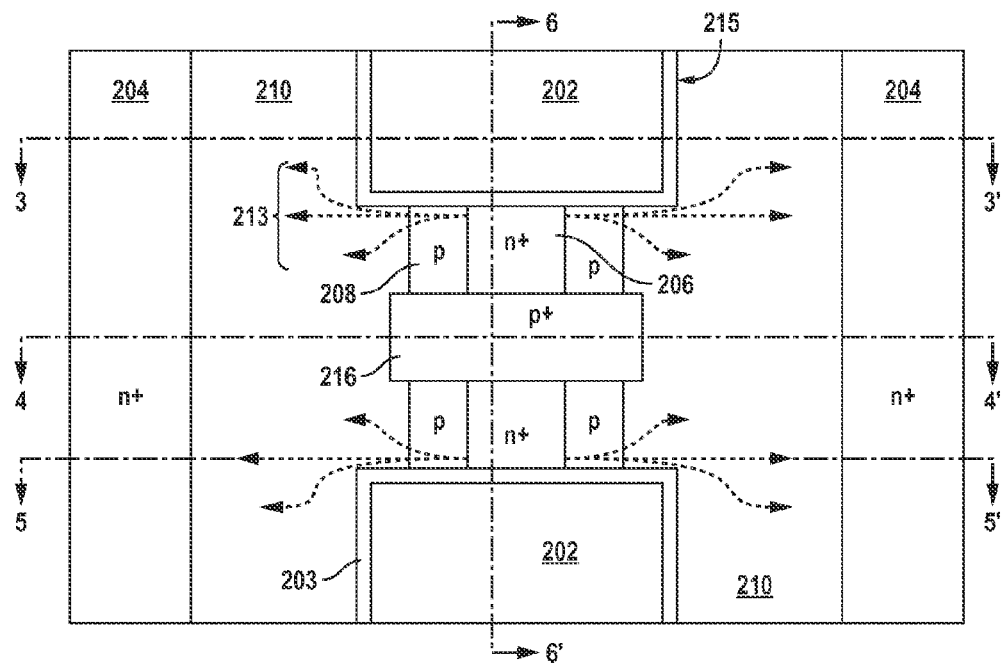

FIG. 4 shows the cross sectional view at cut-line 4-4' in FIG. 2. Alternating charge balance layers 212, 214 extend horizontally between heavy body region 216 and drain regions 204 on either side of heavy body region 216. Heavy body region 216 extends through the interleaved layers, reaching substrate 201. This ensures that all p layers 214 of the interleaved layers have a direct path to ground potential (i.e., substrate potential).

Figure 5:
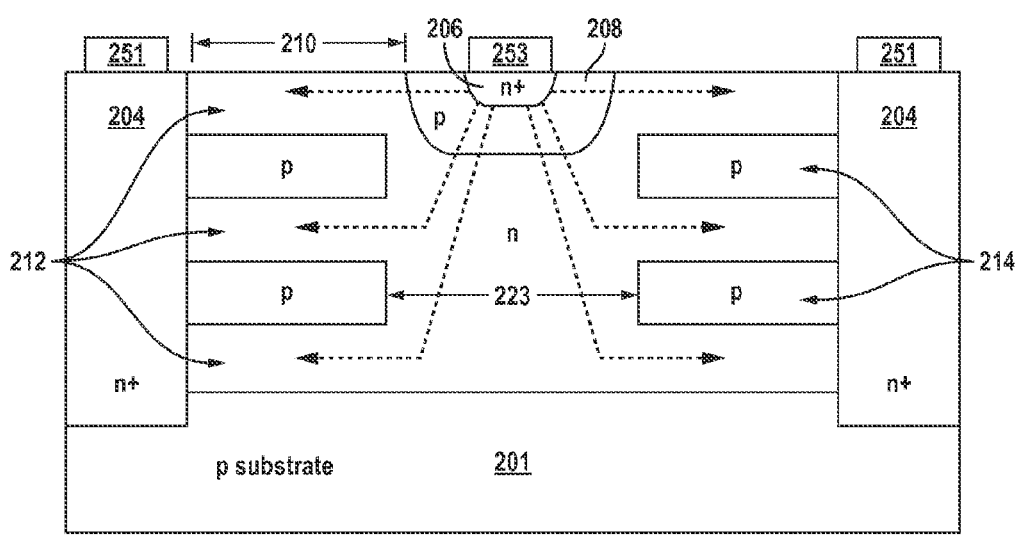
FIG. 5 shows the cross sectional view at cut-line 5-5' in FIG. 2.
Figure 2:
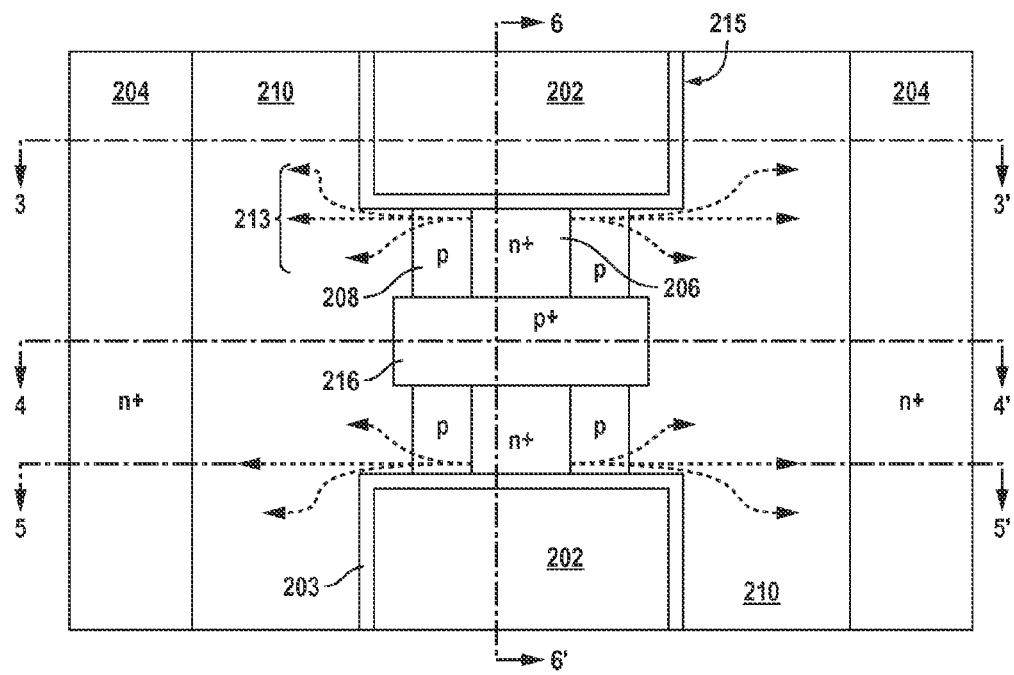

FIG. 5 shows the cross sectional view at cut-line 5-5' in FIG. 2, which is along trench sidewalls where the channel region is formed (i.e., active sides of the trench). Source region 206 is formed inside body region 208. The slice of body region along the trench sidewall between the outer perimeter of source region 206 and the outer perimeter of body region 208 forms the channel region. The depths of the source and body regions determine the channel length. P-type layers 214 of the interleaved layers extending between drain regions 204 include a discontinuity directly underneath body region 208. The discontinuity is marked in FIG. 5 by reference numeral 223, and is also marked in the top layout view along a plane through a p layer 214 shown in FIG. 7. The discontinuity 223 near the active sides of the trench advantageously enables the current (shown in FIG. 5 by dotted arrow lines) to spread out and flow through n layers 212 of the interleaved layers, thus minimizing $R_{DSon}$. Source interconnect layer 253 contacts source regions 206 and drain interconnect layer 251 contacts drain regions 204.

Figure 6:
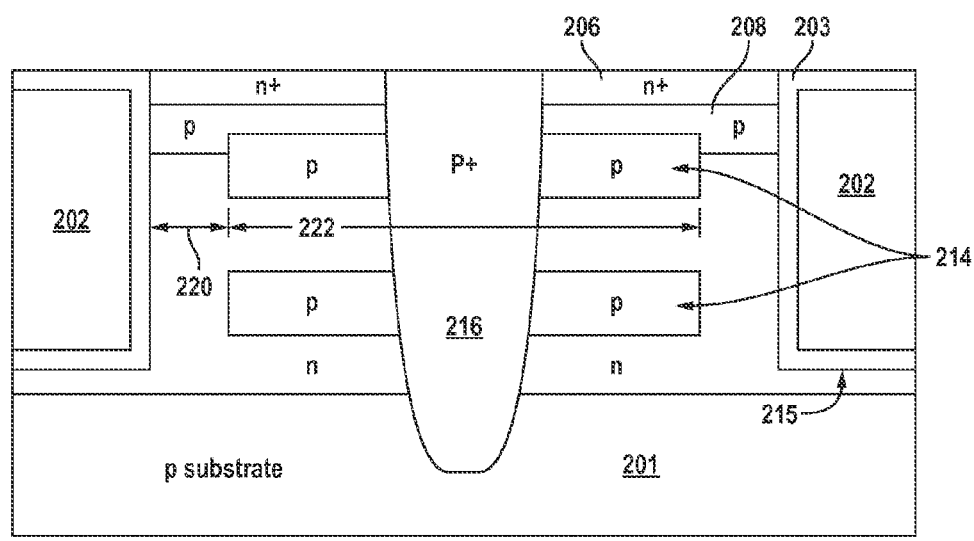
FIG. 6 shows the cross sectional view at cut-line 6-6' in FIG. 2.
Figure 2:
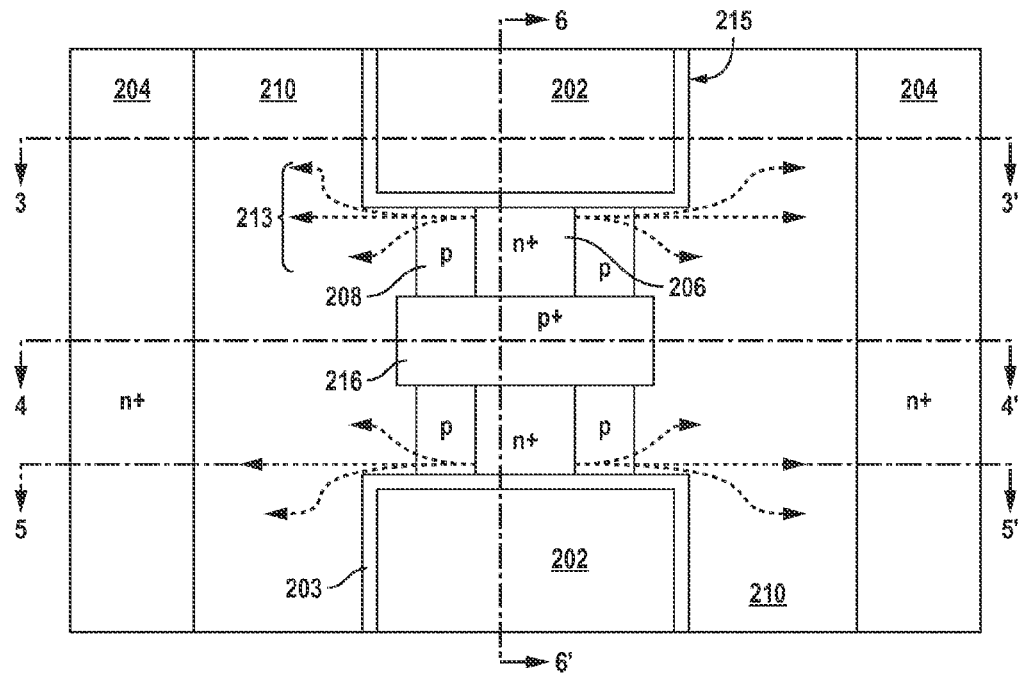

FIG. 6 shows the cross sectional view at cut-line 6-6' in FIG. 2, which is a cross sectional perpendicular to the cross sectionals of FIGS. 3-5. The dimensions of some of the regions in FIG. 6 are made wider than the corresponding regions in the FIG. 2 plan view for clarity. For example, source regions 206 and body regions 208 appear wider in FIG. 6 than in FIG. 2. In FIG. 6, trench gates 215 extend clear past the body region 208 and terminate deep in the drift region. While trench gate 215 is not required to terminate so deep in the drift region (i.e., it could terminate shortly past body region 203), doing so improves the device on-resistance. In one embodiment where a lower gate to drain capacitance Cgd is desired, trench gates 215 are extended to a shallower depth. Source regions 206 extend between the centrally located heavy body region 216 and the active sides of trench gates 215. Body region 208 extends along the entire spacing between the active sides of trench gates 215. Heavy body region 216 extends down through the interleaved layers, reaching substrate 201.

Figure 7:
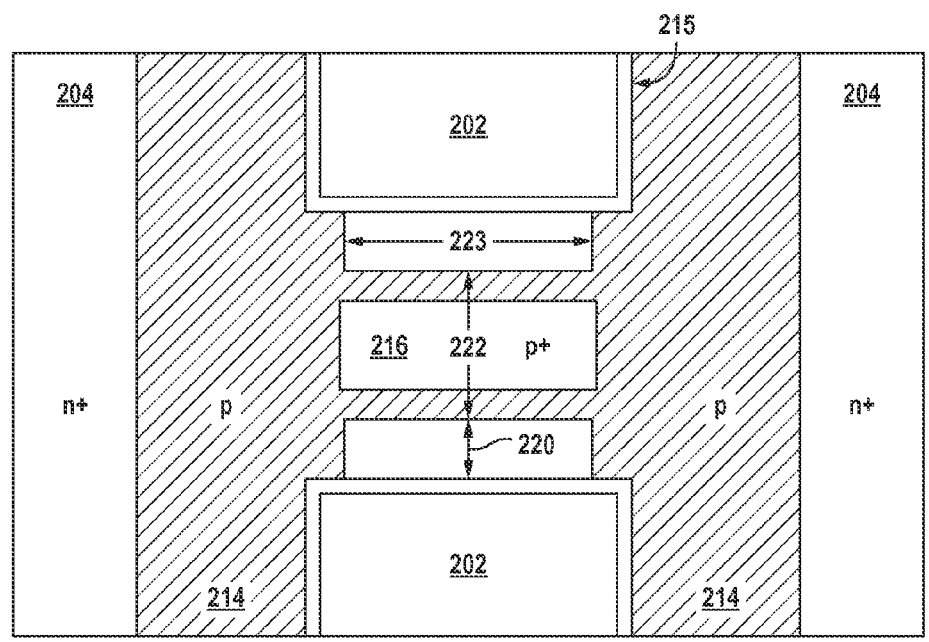
FIG. 7 shows a top view along a plane through a charge balancing layer, according to an embodiment of the invention.

The interleaved layers extend through the region between active sides of trench gates 215, but are spaced a distance 220 from trench gates 215. The width of the portion of p layers 214 extending between trench gates 215 is marked by reference numeral 222. The spacing 220 and p layer width 222 are also marked in the top layout view in FIG. 7. In FIG. 7, the notches in p layer 214 defined by spacings 220 and 223 are formed around the channel regions to advantageously allow the current to spread out and flow through the n layers of the interleaved charge balance layers with minimal resistance. In one embodiment, the notches in p-type layer 214 are the same size as source regions 206. This enables using the same mask used to define the source regions 206 to also define the notches in p layers 214, thus eliminating a masking layer/step. In another embodiment, the notches in p layers 214 are eliminated so that p layers 214 extend below the channel region. This eliminates the process steps needed to form the notches in p layers 214.

Figure 8:
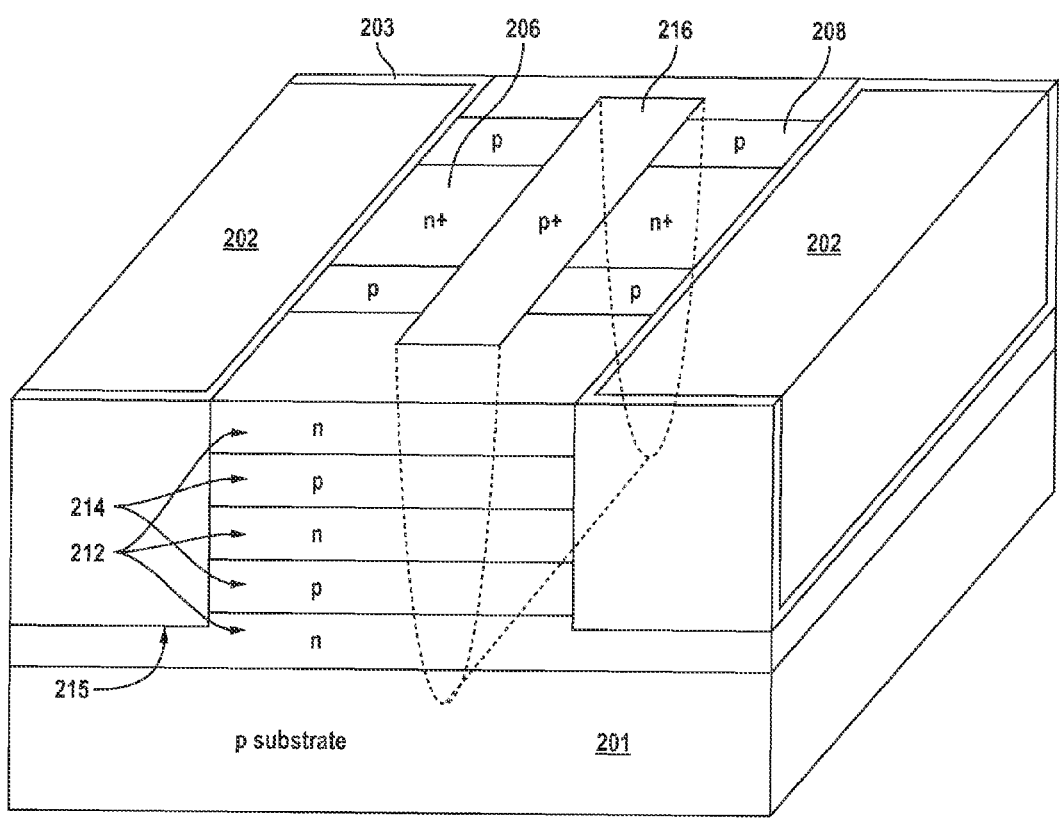
FIG. 8 shows an isometric view of the trench gate LDMOS of FIG. 2.

In FIG. 8, an isometric view corresponding to the cross sectional view in FIG. 6 is shown. Source regions 206, body region 208, and heavy body region 206 extend between the active sides of trenches 215. The dotted lines show how the heavy body region 216 extends through the interleaved layers 212, 214 and into substrate 201.

A method for forming the LDMOS depicted by FIGS. 1-8 will be described next. The interleaved layers 112, 114 may be formed over substrate 201 using any one of a number of known techniques. These techniques typically involve use of photolithography and ion implantation of n-type dopants such as arsenic or phosphorus, and p-type dopants. The physical dimensions of the interleaved layers and the dose and energy for each of the ion implantations are chosen to ensure charge balance.

In one embodiment, the first n-p pair of layers at the bottom of the stack of interleaved layers is formed in a first n-type epitaxial silicon layer extending over a p-type substrate by implanting p-type dopants into the first epitaxial layer. A second n-type epitaxial silicon layer is subsequently formed over the first epitaxial layers, and is then implanted with p-type dopants to form a second n-p pair of layers in the second epitaxial layer. These steps are repeated until the desired number of interleaved n-p layers is formed.

In another embodiment, the interleaved layers are formed by forming multiple p-type epitaxial layers and implanting n-type dopants into the p-type epitaxial layers.

In yet another embodiment, the interleaved layers may be formed by growing an undoped epitaxial layer over a substrate, implanting n-type dopants to form a first n-type layer, and subsequently implanting p-type dopants to form a p-type layer over the first n-type layer. A second undoped epitaxial layer is then grown over the first epitaxial layer, and the steps are repeated until the desired number of interleaved n-p layers is formed.

In still another embodiment, the interleaved layers are formed by growing a single, undoped, epitaxial layer, and then doping the epitaxial layer with multiple high-energy implants of alternating conductivity types. Alternatively, the interleaved layers are formed by growing a first n-type epitaxial layer over a substrate, and subsequently growing a p-type epitaxial layer over the first n-type epitaxial layer. The growth of epitaxial layers of alternating conductivity type is repeated until the desired number of interleaved layers is formed.

After the charge balance structure is formed, highly doped n-type drain regions 204 extending through the interleaved layers and reaching the substrate is formed using known techniques such as diffusion sinker technique. Trenches 215 extending through the interleaved layers are then formed using conventional methods. In one embodiment, the trench gate and the deep drain diffusion are formed in the reversed order. After forming trenches 215, a gate dielectric layer 203 lining the trench sidewalls and bottom is formed using known techniques. In one embodiment, before forming the gate dielectric, a thick bottom dielectric (TBD) is formed along a bottom portion of trench 215 using known techniques. In yet another embodiment, a gate dielectric layer is formed along the active sidewalls of the trenches, and a thicker dielectric layer is formed along the non-active sidewalls of the trenches. The TBD and thicker dielectric along non-active trench sidewalls help reduce the gate drain capacitance. In all these various embodiments, a mask can be used to form the notches in p layers shown in FIG. 7. Since the notches in the p layers are to roughly extend around the channel region, the masking step does not require precise alignment.

After forming the dielectric layer 203 in the trenches, gate electrode 202 (e.g., comprising doped polysilicon) fills trenches 215. In one embodiment, gate electrode 202 is recessed into trenches 215. Next, body region 208 extending between adjacent trenches is formed using conventional implantation of dopants. Source regions 206 are then formed in body region 208 by implanting n-type dopants. Finally, the highly doped heavy body region 216 is formed by implanting dopants of p-type conductivity in the region between source regions 206. Conventional process steps are carried out to form the remaining layers and regions of the LDMOS, including the overlying dielectric and interconnect layers.

While the above provides a complete description of the preferred embodiments of the invention, many alternatives, modifications, and equivalents are possible. Those skilled in the art will appreciate that the same techniques can apply to other types of super junction structures as well as more broadly to other kinds of devices. For example, the super junction structures need not be in the form of interleaved layers, and may take other layered forms such as, for example, fibers or honeycomb structures. As another example, in the embodiments described herein, the conductivity type of the various regions can be reversed to obtain p-channel LDMOS. For these and other reasons, therefore, the above description should not be taken as limiting the scope of the invention, which is defined by the appended claims.

What is claimed is:

1. A method of forming a field effect transistor (FET) comprising:
   forming a drift region comprising a stack of alternating conductivity type silicon layers;
   forming a drain region of a first conductivity type extending into the stack of alternating conductivity type silicon layers;
   forming a trench gate extending into the stack of alternating conductivity type silicon layers, the trench gate having a vertically extending non-active sidewall and a vertically extending active sidewall being perpendicular to one another; and
   forming a body region of a second conductivity type adjacent to the active sidewall of the trench gate, wherein the trench gate and the drain region are formed such that the non-active sidewall of the trench gate faces the drain region and the body region extends along the active sidewall but not the non-active sidewall.

2. The method of claim 1 further comprising:
   forming a source region of the first conductivity type in the body region such that a channel region is formed in the body region between an outer perimeter of the source region and an outer perimeter of the body region.

3. The method of claim 2 further comprising:
   forming an interconnect layer including a source interconnect portion electrically contacting the source region and a drain interconnect portion electrically contacting the drain region.

4. The method of claim 3 further comprising:
   forming a dielectric layer lining the active sidewall, the non-active sidewall, and a bottom of the trench gate; and
   forming a gate electrode at least partially filling the trench gate.

5. The method of claim 4 wherein the step of forming a dielectric layer comprises:
   forming a bottom dielectric layer along the bottom of the trench gate; and
   forming a sidewall dielectric along the active sidewall and the non-active sidewall of the trench gate, the bottom dielectric being thicker than the sidewall dielectric.

6. The method of claim 2 further comprising:
   forming a heavy body region adjacent to the source region.

7. The method of claim 6 wherein the stack of alternating conductivity type silicon layers is formed over a substrate of a second conductivity type, the heavy body region being formed so as to vertically extend through the stack of alternating conductivity type silicon layers and terminate within the substrate.

8. The method of claim 6 wherein the heavy body region is formed so as to vertically extend through the stack of alternating conductivity type silicon layers and electrically short those silicon layers of the stack having the second conductivity type.

9. The method of claim 1 wherein the stack of alternating conductivity type silicon layers is formed such that those silicon layers of the stack having a second conductivity type are laterally spaced from the sidewalls of the trench gate so as not to extend beneath the body region.

10. The method of claim 1 wherein the stack of alternating conductivity type silicon layers is formed such that those silicon layers of the stack having a second conductivity type do not extend beneath the body region.

11. The method of claim 1 wherein the drain region is formed so as to vertically extend through the stack of alternating conductivity type silicon layers and electrically short those silicon layers of the stack having the first conductivity type.

12. The method of claim 1 wherein the stack of alternating conductivity type silicon layers is formed over a substrate of the second conductivity type, the drain region being formed so as to vertically extend through the stack of alternating conductivity type silicon layers and terminate within the substrate.

13. The method of claim 1 wherein the step of forming a drift region comprises:
   forming an epitaxial layer of the first conductivity over a substrate of a second conductivity type; and
   implanting dopants of a second conductivity type into the epitaxial layer so as to convert an upper region of the epitaxial layer to the second conductivity type.

14. The method of claim 1 wherein the step of forming a drift region comprises:
   forming an epitaxial layer of the first conductivity over a substrate of a second conductivity type; and
   forming a second epitaxial layer of the second conductivity over the first epitaxial layer.

15. The method of claim 1 wherein the step of forming a drift region comprises:
   forming an epitaxial layer over a substrate of a second conductivity type;
   implanting dopants of the first conductivity type into the epitaxial layer so as to convert a lower portion of the epitaxial layer to the first conductivity type; and
   implanting dopants of the second conductivity type into the epitaxial layer so as to convert an upper portion of the epitaxial layer to the second conductivity type.

\* \* \* \* \*